(12) United States Patent
Ligander

(10) Patent No.: US 8,081,044 B2
(45) Date of Patent: Dec. 20, 2011

(54) SURFACE-MOUNTABLE WAVEGUIDE ARRANGEMENT HAVING A SOLDER CONTACT AREA WITH AN INTERNAL SOLDERSTOP LINE

(75) Inventor: Per Ligander, Göteborg (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 225 days.

(21) Appl. No.: 12/517,328

(22) PCT Filed: Jun. 19, 2007

(86) PCT No.: PCT/SE2007/050435
§ 371 (c)(1), (2), (4) Date: Jun. 2, 2009

(87) PCT Pub. No.: WO2008/069733
PCT Pub. Date: Jun. 12, 2008

(65) Prior Publication Data
US 2010/0052825 A1    Mar. 4, 2010

(30) Foreign Application Priority Data
Dec. 5, 2006 (SE) .......................... PCT/SE06/50543

(51) Int. Cl.
*H01P 5/107* (2006.01)
(52) U.S. Cl. ........................................... 333/26; 333/34
(58) Field of Classification Search ................... 333/26, 333/34, 246
See application file for complete search history.

(56) References Cited

U.S. PATENT DOCUMENTS

| | | | |
|---|---|---|---|
| 4,322,778 A | 3/1982 | Barbour et al. | |
| 6,040,739 A * | 3/2000 | Wedeen et al. | 330/66 |
| 6,940,361 B1 * | 9/2005 | Jokio et al. | 333/26 |
| 2003/0141940 A1 * | 7/2003 | Le Bihan et al. | 333/26 |
| 2006/0097819 A1 * | 5/2006 | Lo Hine Tong et al. | 333/26 |

FOREIGN PATENT DOCUMENTS
EP    1677382 A1    7/2006

OTHER PUBLICATIONS

Muller, Thomas J. et al; Surface-mountable metalized plastic waveguide filter suitable for high volume production; 2003; 33rd European Microwave Conference, Munich 2003; pp. 1255-1258.*

* cited by examiner

*Primary Examiner* — Benny Lee

(57) ABSTRACT

A surface-mountable waveguide arrangement comprising a dielectric carrier material having a first main side and a second main side, the second side comprising a ground plane, and the first side being arranged to form a microwave circuit layout by means of metallization patterns on the respective sides. The microwave circuit layout comprises a footprint for a surface-mountable waveguide part, the waveguide part comprising an open side, a part of the footprint constituting a closing wall arranged for closing the open side. The waveguide part is arranged for being mounted to a footprint solder area comprised in the footprint, having an outer contour and corresponding to a solderable contact area on the waveguide part. A solderstop line is formed on the footprint, at least partly defining a border between the closing wall and the footprint solder area. The present invention also relates to a dielectric carrier.

14 Claims, 6 Drawing Sheets

A-A

A-A

SURFACE-MOUNTABLE WAVEGUIDE ARRANGEMENT HAVING A SOLDER CONTACT AREA WITH AN INTERNAL SOLDERSTOP LINE

TECHNICAL FIELD

The present invention relates to a surface-mountable waveguide arrangement comprising a dielectric carrier material having a first main side and a second main side, the second side comprising a ground plane, and the first side being arranged to form a microwave circuit layout by means of metalization patterns on the respective sides, the microwave circuit layout comprising a footprint for a surface-mountable waveguide part. The arrangement further comprises a waveguide part comprising an open side, a part of the footprint constituting a closing wall arranged for closing the open side, where the waveguide part is arranged for being mounted to a footprint solder area comprised in the footprint, the footprint solder area having an outer contour and corresponding to a solderable contact area on the first waveguide part.

The present invention also relates to a dielectric carrier material having a first main side and a second main side, the second side comprising a ground plane, and the first side being arranged to form a microwave circuit layout by means of metalization patterns on the respective sides, the microwave circuit layout comprising a footprint for a surface-mountable waveguide part. A part of the footprint constitutes a closing wall arranged for closing an open side of the surface-mountable waveguide part, the footprint further comprising a footprint solder area having an outer contour.

BACKGROUND

When designing microwave circuits, microstrip transmission lines are commonly used. A microstrip transmission line comprises a metal ground plane and a conductor, where a dielectric carrier material is positioned between the metal ground plane and the conductor. This configuration is economical and relatively easy to design.

However, due to losses in the dielectric carrier material, it is sometimes not possible to use microstrip transmission lines. When there for example is a filter in the layout, the filter may have to be realized in waveguide technology. Waveguides normally are filled with air or other low-loss materials.

When there is a filter in a microwave circuit microstrip layout, the filter may thus be realized by means of a waveguide filter in order to lower the losses. In that case, there has to be corresponding microstrip to waveguide transitions at the ends of the filter. Such a waveguide is preferably surface-mounted, enabling it to be mounted to the dielectric carrier material.

Such a surface-mounted waveguide is normally made having three walls and one open side. Metalization is then provided on the side of the dielectric carrier material facing the waveguide, where the metalization serves as the remaining wall of the waveguide, thus closing the waveguide structure when the waveguide is fitted to the dielectric carrier material.

Another application for surface-mounted waveguides is when there has to be a microstrip to waveguide transition in the form of a bend, allowing a waveguide to be mounted to the dielectric carrier material in such a way that it extends essentially perpendicular to the main surfaces of the dielectric carrier material.

It is also conceivable that a waveguide filter is realized having a separate fourth closing wall made as a metalization on a dielectric carrier material, where such a design is found cost-effective.

As disclosed in the paper "Surface-mountable metalized plastic waveguide filter suitable for high volume production" by Thomas J Müller, Wilfried Grabherr and Bernd Adelseck, $33^{rd}$ European Microwave Conference, Munich 2003, a surface-mountable waveguide is mounted on a so-called footprint, a metalization that generally follows the structure that shall be soldered to it, in this case the contact surface of the waveguide. Furthermore, the footprint comprises the fourth closing wall for the waveguide. Outside the footprint, a so-called solderstop is applied, a type of wall preventing solder from flowing outside the footprint. Solder is dispensed sparsely and self-alignment occurs during soldering.

There is, however, a problem with the design according to the paper, since it still is difficult to control the height of the solder joint. This height is very important to control, since it becomes a part of the waveguide design, and has to be taken into account as a design parameter when designing the waveguide. If this height is inadequately controlled, the waveguide will not function as desired, since the distance between the closing wall and the opposite wall will not be the desired one. This problem of course grows with higher frequency.

There is thus a demand for a surface-mounted waveguide arrangement that provides a more accurate control of the mounted solder height, and a surface-mount method that provides a more accurate control of the mounted solder height. This allows for a very good prediction of the mounted solder height.

SUMMARY OF THE INVENTION

The object of the present invention is to provide a surface-mounted waveguide arrangement that provides a more accurate control of the mounted solder height.

This problem is solved by means of a surface-mounted waveguide arrangement as mentioned initially. The arrangement further comprises a solderstop line formed on the footprint, at least partly defining a border between the closing wall and the footprint solder area.

According to a preferred embodiment, the solderable contact area has a width that extends between an inner edge and an outer edge, where the solderstop line is arranged to be positioned inside the inner edge when the waveguide part is mounted to the dielectric carrier material.

According to another preferred embodiment, the solderable contact area comprises a continuous part extending along an inner wall, and a plurality of discrete parts that are separate from the continuous part and being placed between the continuous part and an outer wall, and where the footprint solder area is formed correspondingly.

According to another preferred embodiment, the surface-mountable waveguide part also comprises a first wall, a second wall, a third wall, a fourth wall, and a fifth wall, where the first four walls essentially form a circumference and the fifth wall constitutes a roof on the top of the waveguide part, connecting the first four walls, the roof being essentially parallel to, and facing away from, the dielectric carrier material when the first waveguide part is mounted to the dielectric carrier material.

According to another preferred embodiment, at least one of the first wall, the second wall, the third wall, and the fourth wall has an opening for an incoming microstrip feed line, the surface-mountable waveguide part comprising at least one corresponding microstrip to waveguide transition.

According to another preferred embodiment, the surface-mountable waveguide part further comprises a bend, the bend being essentially 90°.

According to another preferred embodiment, the closing wall copper structure comprises at least one opening encompassed by the closing wall, the opening constituting a waveguide opening, the opening having smaller dimensions than a regular waveguide opening for the dimensions used due to the positioning of the solderstop line.

According to another preferred embodiment, the opening extends through all of the dielectric carrier material.

According to another preferred embodiment, an iris in the form of a ridge is positioned on the fifth wall, passing essentially perpendicularly between the second wall and the third wall, on the inside of the surface-mounted wave-guide.

The problem is also solved by means of a dielectric carrier as mentioned initially. The dielectric carrier further comprises a solderstop line formed on the footprint, at least partly defining a border between the closing wall and the footprint solder area.

A number of advantages are provided by the present invention. For example:

The surface-mounted waveguide arrangement has a controlled mounted solder height, allowing the design to function as desired even at high frequencies.

The surface-mounted waveguide arrangement is better aligned by means of an enhanced self-alignment.

BRIEF DESCRIPTION OF DRAWINGS

The present invention will now be described more in detail with reference to the appended drawings, in which like features in different drawing figures are denoted by like reference numbers, which may not be described in detail in every drawing in which they appear and where:

FIG. 2b shows a cross-section view along section line A-A of FIG. 2a;

FIG. 7b shows a cross-section view along section line A-A of FIG. 7a;

DETAILED DESCRIPTION OF THE INVENTION

Figure 1:
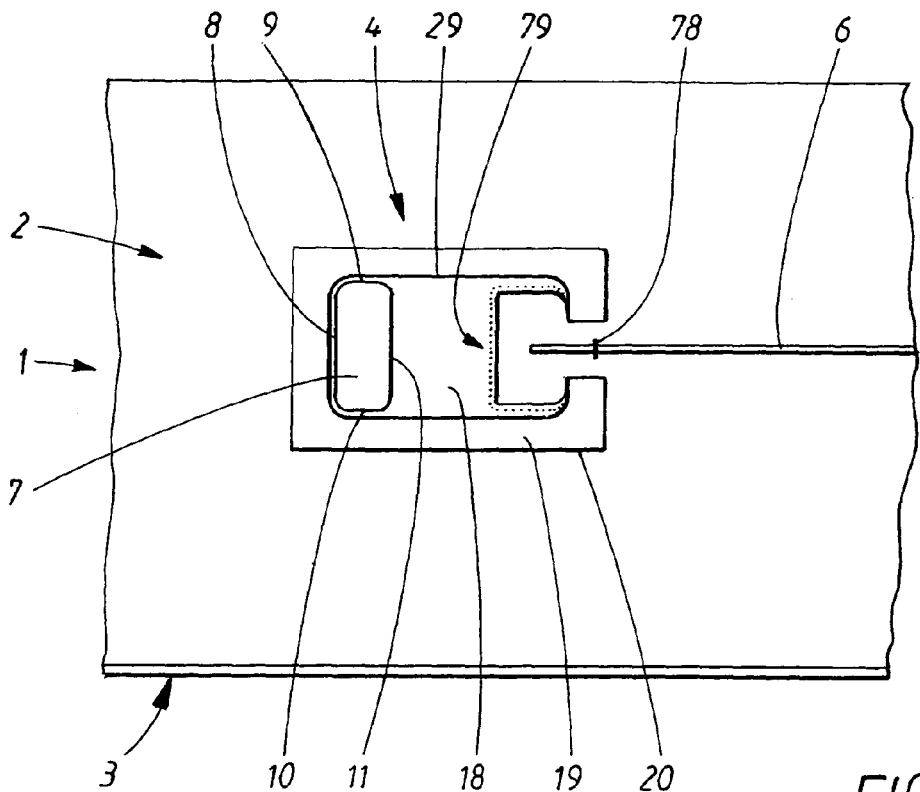
FIG. 1 shows a top view of a carrier part of a first embodiment example of the arrangement according to the present invention.

In FIG. 1, showing a first embodiment example of the present invention, a dielectric carrier material 1 is shown, having a first main side 2 and a second main side 3, originally having a metallic copper cladding on both sides. The copper on the second main side 3 is used as a ground plane, and the copper on the first main side 2 is etched away to such an extent that desired copper patterns are formed on the first main side 2. These copper patterns form a microwave circuit layout, e.g. microstrip transmission line conductors and footprints for components which are intended to be soldered to the dielectric carrier.

Figure 2A:
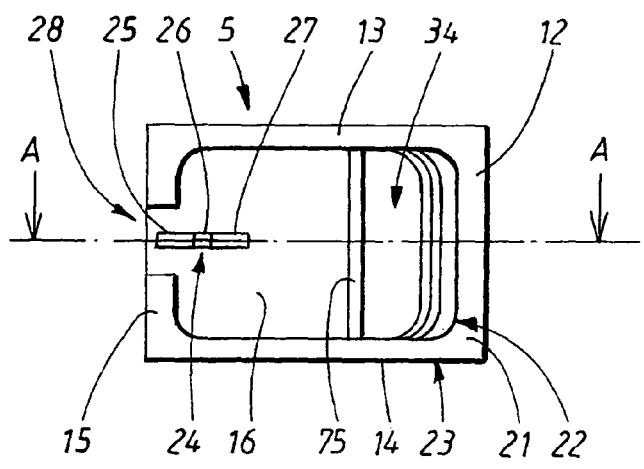
FIG. 2a shows a bottom view of a waveguide part of a first embodiment example of the arrangement according to the present invention.
Figure 2B:
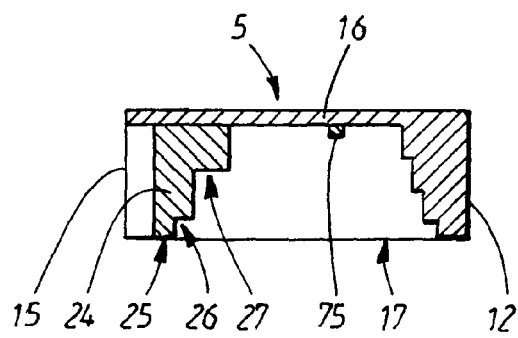

A footprint 4, formed on the first main side 2 of the dielectric carrier 1, is intended for use as a waveguide footprint for a first surface-mountable waveguide part (not shown in FIG. 1). The first surface-mountable waveguide part 5, as shown in FIG. 2a and FIG. 2b, intended for being mounted to the footprint shown in FIG. 1, is a transition from a microstrip conductor 6 to a waveguide bend that turns essentially perpendicular to the main surfaces 2, 3 of the dielectric carrier 1 and extends through an opening 7 in the dielectric material 1, forming a waveguide contact interface, or waveguide port, on the second side 3 of the dielectric carrier 1. The opening 7 has an essentially rectangular shape, having a first side 8, a second side 9, a third side 10 and a fourth side 11, where the corners are slightly rounded due to manufacturing methods. The fourth side 11 faces the incoming microstrip conductor 6.

As shown in FIGS. 2a and 2b, the first surface-mountable waveguide part 5 comprises a first wall 12, a second wall 13 (FIG. 2a), a third wall 14 (FIG. 2a), a fourth wall 15, a fifth wall 16 and one open side 17 (FIG. 2b). The first four walls 12, 13, 14, 15 essentially form a circumference, where the fourth wall 15 faces the incoming microstrip conductor 6 (FIG. 1). The fifth wall 16 constitutes a roof on the top of the first waveguide part 5, connecting the first four walls 12, 13, 14, 15, the roof being essentially parallel to, and facing away from, the dielectric carrier material 1 when the first waveguide part 5 is mounted to the dielectric carrier material 1.

Returning to the description of FIG. 1, a closing wall 18 of the footprint 4 serves as a remaining sixth wall of the waveguide part 5, thus closing the waveguide part 5, when the waveguide part 5 is fitted to the dielectric carrier material 1, constituting a closing wall 18. The rest of the footprint 4 forms a solder area 19 having an outer contour 20, where the footprint solder area 19 corresponds to a solderable contact area 21 (FIG. 2a) on the first waveguide part 5. This solderable contact area 21 has an extent more or less along the circumference of the first waveguide part 5, being constituted by one edge of the first four walls 12, 13, 14, 15, and having a width that is suitable for a solder joint. The width extends between an inner edge 22 and an outer edge 23, as shown in FIG. 2a. The outer edge 23 essentially follows the outer contour 20 of the footprint solder area 19 in FIG. 1.

The transition from the microstrip conductor 6 to the first waveguide part 5 is formed as a first stepped structure 24 (FIGS. 2a, 2b) having a height perpendicular to the main extension of the fifth wall 16 and a width that corresponds to the width of the microstrip conductor 6. The first stepped structure 24 has a contact part 25 (FIGS. 2a, 2b) that is arranged to be in the same level as the microstrip conductor 6 when the first waveguide part 5 is mounted to the dielectric carrier 1.

The contact part 25 is arranged for being soldered to the microstrip conductor 6. The rest of the first stepped structure 24 forms steps 26 (FIGS. 2*a*, 2*b*), 27 (FIGS. 2*a*, 2*b*) that lead towards the fifth wall 16 of the first waveguide part 5, and is preferably formed integrally with the first waveguide part 5. When the first waveguide part 5 is mounted to the dielectric carrier 1, the microstrip conductor 6 enters into the first waveguide part 5 via an opening 28 (FIG. 2*a*) in the fourth wall 15, and extends until the stepped structure's contact part 25 ends. At the opening 28, the solderable contact area 21 is of course interrupted.

Such a transition is well-known in the art, and will not be discussed more in detail here.

According to the present invention, and with reference to FIG. 1, a solderstop line 29 is formed on the footprint 4, almost following the inner edge 22 (FIG. 2*a*) of the solderable contact area 21 (FIG. 2*a*) of the first waveguide part 5 when the first waveguide part 5 is mounted to the dielectric carrier material 1, but positioned slightly inside the inner edge 22. The solderstop line 29 then defines a border between the closing wall 18 of the footprint 4 and the footprint solder area 19. There is a distance between the inner edge 22 of the solderable contact area 21 of the first waveguide part 5 and the solderstop line 29 when the first waveguide part 5 is mounted to the dielectric carrier material 1. This distance represents mounting tolerance, as it is undesirable that any part of the solderable contact area 21 is placed on the solderstop line 29, and is about 100 μm. The width of the solderstop line 29 is about 200 μm. These measures are of course only an example of a preferred embodiment and may vary.

The solderstop line 29 follows the inner edge 22 of the solderable contact area 21 of the first waveguide part 5 when the first waveguide part 5 is mounted to the dielectric carrier material 1, and stops only at the place at the footprint 4 where the microstrip conductor opening 28 is arranged to be placed.

Figure 3:
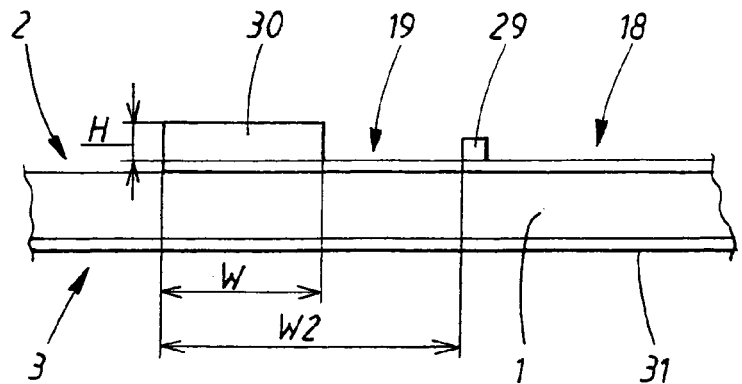
FIG. 3 shows an enlarged side view of a part of FIG. 1, with a solder line dispensed.

When mounting, with reference to FIG. 3, showing an enlarged cross-section of the area around the footprint solder area 19 according to FIG. 1, a solder line 30 is dispensed, having a certain height H and a certain width W. The width W of the solder line 30 is preferably about half the width W2 of the footprint solder area 19. The solder line 30 is dispensed on the footprint solder area 19 of footprint as far from the solderstop line 29 as possible. In FIG. 3, the ground plane 31 of the dielectric carrier material 1 is shown.

The mounting continues by placing the first waveguide part 5 (FIG. 2*a*) on the solder line 30 (FIG. 3) on the footprint solder area 19, preferably by means of a pick-and-place machine. Then the arrangement is heated, where the solder melts and fluxing agents evaporate. When the fluxing agents have evaporated, roughly half the solder amount remains. When melted, the solder flows towards the solderstop line, and the height H2 of a resulting solder joint 32 is roughly a quarter of the original height H, as shown in the enlarged cross-sectional FIG. 4, the cross-section in FIG. 4 being equivalent to the cross-section of FIG. 3. Should the pick-and-place machine mount the first waveguide part 5 slightly obliquely, self-alignment occurs and corrects the errors.

Figure 4:
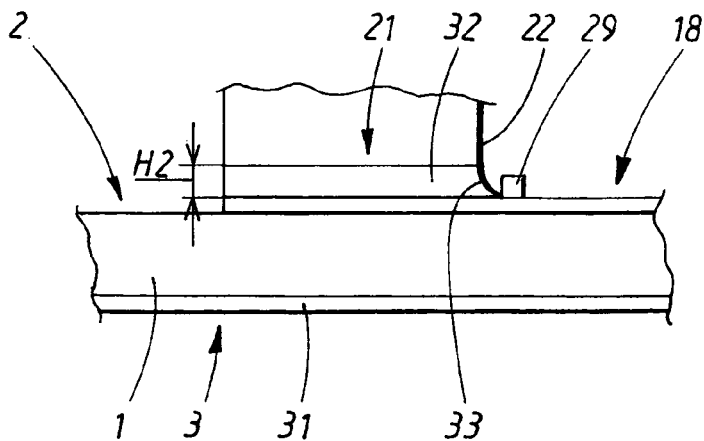
FIG. 4 shows FIG. 3 with the waveguide part mounted.

As shown in detail in FIG. 4, the solder follows a fillet shape 33 between the inner edge 22 of the solderable contact area 21 and the solderstop line 29.

This mounting provides a very accurate prediction of the mounted solder height H2, and also provides a very good self-alignment function. The dispensing of the solder line 30 as far from the solderstop line 29 as possible results in a relatively slow solder approach towards the solderstop line 29 when the solder melts, minimizing the risk of solder spilling over the solderstop line 29.

As shown in FIG. 1, the solderstop line 29 partly extends along the circumference of the first opening 7 in the dielectric material 1, passing the first side 8, the second side 9 and the third side 10. The solderstop line 29 is placed inside the inner edge 22 (FIG. 2*a*) of the solderable contact area 21 (FIG. 2*a*) on the first waveguide part 5 when the first waveguide part 5 is mounted to the dielectric material 1, and the inner edge 22 partly follows an incomplete waveguide opening 34 in the first waveguide part.

The incomplete waveguide opening 34 (FIG. 2*a*) is only completed when the first waveguide part 5 is mounted to the dielectric material 1 and the closing wall 18 is positioned. Then, the first opening 7 and sides 8, 9, 10, 11 are slightly inside the inner edge 22 of the incomplete waveguide opening 34 due to the fact that the solderstop line 29 is positioned between the inner edge 22 of the incomplete waveguide opening 34 and the opening sides 8, 9, 10, 11. The first waveguide opening is preferably arranged to constitute a standard opening, for example IEC R-220, the first opening thus being slightly smaller than IEC R-220.

Figure 5:
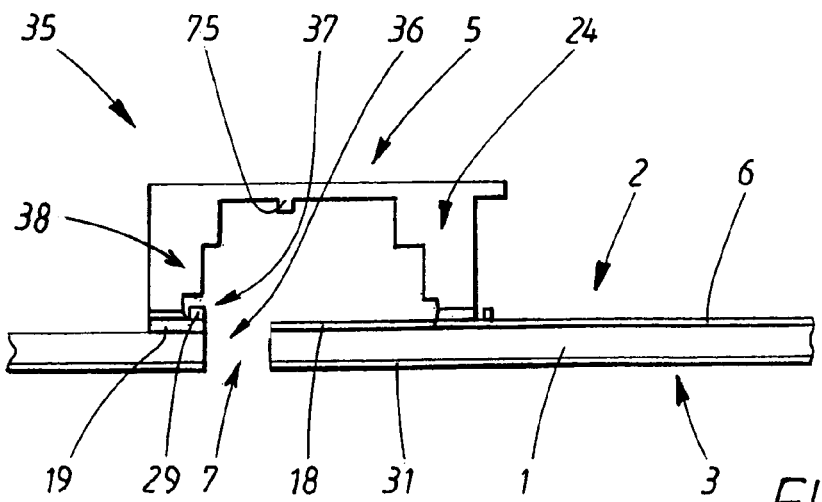
FIG. 5 shows the waveguide part mounted to the carrier part.

This of course creates a discontinuity in the assembled waveguide arrangement 35, as shown in a cross-sectional view in FIG. 5. Firstly, there is a step in size from the first, now complete waveguide opening 36 to the first opening 7. Secondly, at the interface between the larger first complete waveguide opening 36 and the smaller first opening 7, a small pocket 37 is created. There is a second stepped structure 38 at the part of the first waveguide part 5 where the essentially perpendicular bend takes place, i.e. at the incomplete waveguide opening 34 (FIG. 2*a*). Such a stepped structure 38 at a waveguide bend is well known in the art, and its specific features will not be discussed further here. However, due to the second stepped structure 38 the pocket 37 is created since there is a step in size from the first, now complete, waveguide opening 36 to the first opening 7.

The discontinuity may be matched for by various previously known means, these means mostly provide a narrow-banded matching.

Figure 6:
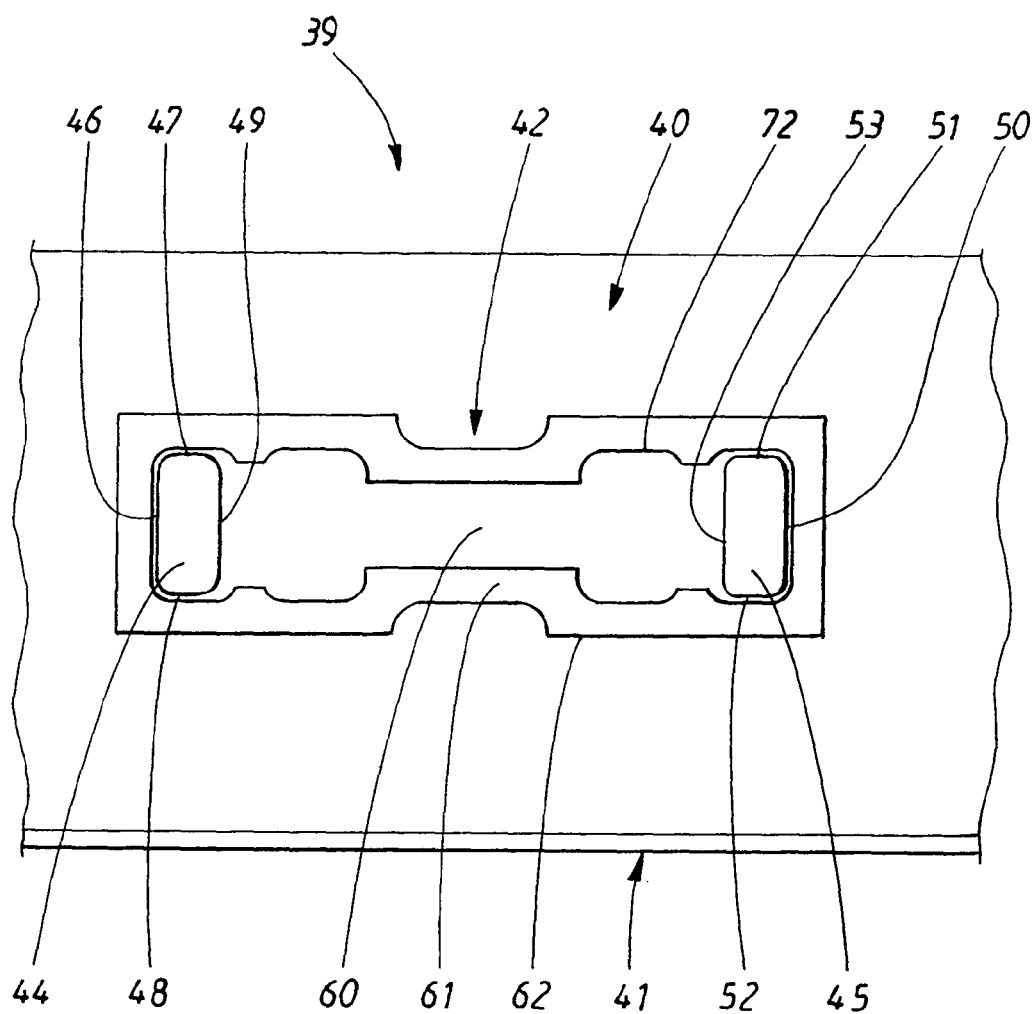
FIG. 6 shows a top view of a carrier part of a second embodiment example of the arrangement according to the present invention.

As shown in FIG. 6, a second embodiment example of the present invention is shown. In FIG. 6, a dielectric carrier material 39 similar to the one discussed previously is shown, having a first main side 40 and a second main side 41. A footprint 42 formed on the first side 40 of the dielectric carrier material 39 is intended for use as a waveguide footprint for a second surface-mountable waveguide part 43. The second surface-mountable waveguide part 43, as shown in FIG. 7*a* and FIG. 7*b*, is a waveguide filter, extending from a first opening 44 in the dielectric material 39 to a second opening 45 in the dielectric material when mounted, the openings 44, 45 forming waveguide interfaces for a suitable waveguide standard.

The first and second openings 44 and 45 have an essentially rectangular shape, having a respective first side 46, 50, a second side 47, 51, a third side 48, 52 and a fourth side 49, 53, where the corners are slightly rounded due to manufacturing methods. The respective fourth sides 49, 53 face each other.

Figure 7A:
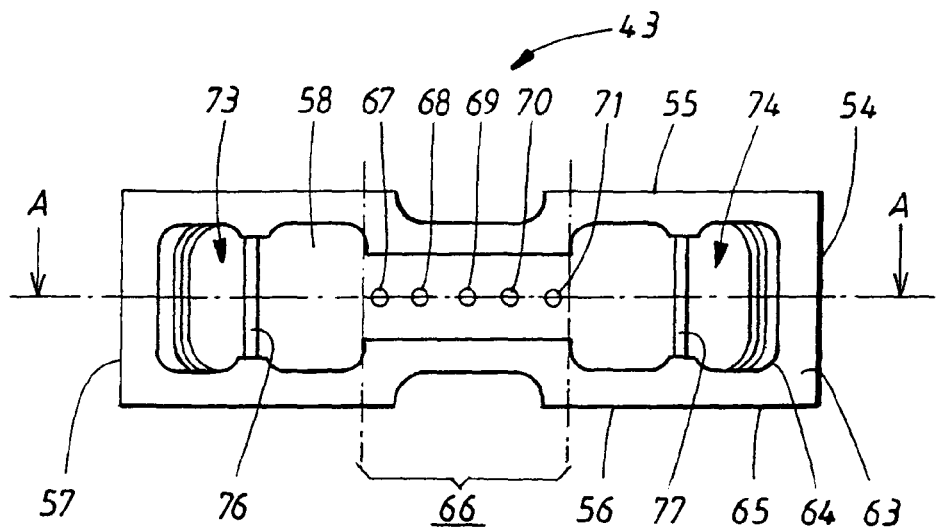
FIG. 7a shows a bottom view of a waveguide part of a second embodiment example of the arrangement according to the present invention.
Figure 7B:
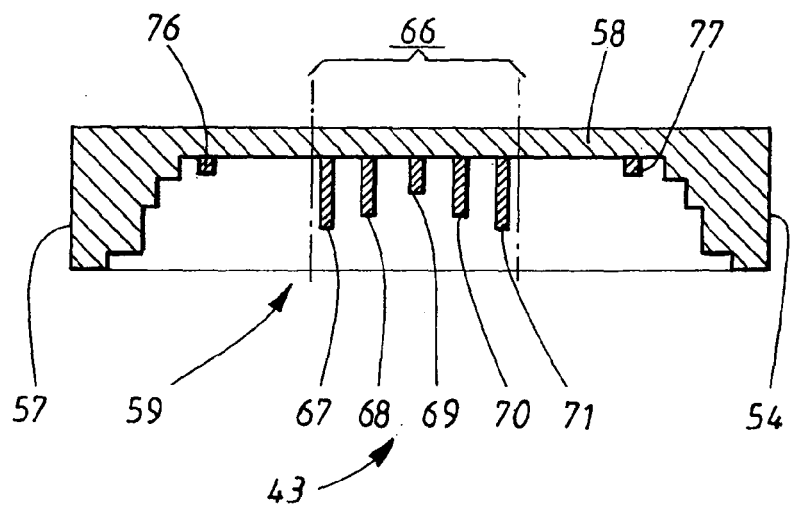

As shown in FIG. 7*a*, the second surface-mountable waveguide part 43 comprises a first wall 54, a second wall 55, a third wall 56, a fourth wall 57, a fifth wall 58 and one open side 59 (FIG. 7*b*). The first four walls 54, 55, 56, 57 essentially form a circumference. The fifth wall constitutes a roof on the top of the second waveguide part 43, connecting the first four walls 54, 55, 56, 57, the roof being essentially parallel to, and facing away from, the dielectric carrier material 39 when the first waveguide part 43 is mounted to the dielectric carrier material 39.

As shown in FIG. 6, a part 60 of the footprint 42 serves as the remaining sixth wall of the waveguide part 43, thus closing the waveguide part 43, when the waveguide part 43 is fitted to the dielectric carrier material 39, the part constituting a closing wall 60.

As for the first embodiment example, as shown in FIG. 7a, the rest of the footprint forms a solder area 61 having an outer contour 62, where the footprint solder area 61 corresponds to a solderable contact area 63 on the second waveguide part 43. This solderable contact area 63 has an extent more or less along the circumference of the second waveguide part 43, and has a width that is suitable for a solder joint. The width extends between an inner edge 64 and an outer edge 65. The outer edge 65 essentially follows the outer contour 62 of the footprint solder area 61.

The surface-mountable waveguide filter 43 is provided with a filter section 66 having filter tabs 67, 68, 69, 70, 71, having adjusted dimensions according to the desired filter characteristics. Such tabs 67, 68, 69, 70, 71 may be made integrally in the waveguide material, or may be in the form of screws, providing an adjustable filter. How waveguide filters are designed is commonly known for the skilled person, and will not be discussed further.

In the same way as described for the first embodiment example, a solderstop line 72 is formed on the footprint 42, as shown in FIG. 6, almost following the inner edge 64 of the solderable contact area 63 of the second waveguide part 43, but positioned slightly inside the inner edge 64, when the second waveguide part 43 is mounted to the dielectric material 39. The solderstop line 72 thus defines a border between the closing wall 60 and the footprint solder area 61.

The solderstop line 72 follows the inner edge 64 of the solderable contact area 63 of the second waveguide part 43, passing around the first 44 and second 45 openings, when the second waveguide part 43 is mounted to the dielectric carrier material 40. The solderstop line thus partly extends along the circumferences of the first 44 and second 45 opening in the dielectric material 40, passing the respective first side 46, 50, second side 47, 51 and third side 48, 52.

As shown in FIG. 7a, inner edge 64 partly follows a first incomplete waveguide opening 73 and a second incomplete waveguide opening 74 in the second waveguide part 43. The incomplete waveguide openings 73, 74 are only completed when the second waveguide part 43 is mounted to the dielectric material 40 and the closing wall 60 is positioned.

For the same reasons as discussed in connection with the first embodiment example, the openings 44, 45 of FIG. 6 are slightly smaller than the corresponding waveguide openings. A discontinuity similar to the one discussed for the first embodiment example is thus created, and has to be compensated for by means of matching.

Many other embodiment examples of surface-mounted waveguides using the present invention are of course conceivable, the ones shown are only examples. Another example is a combination of the first and second embodiment examples, where a surface-mounted waveguide filter has microstrip to waveguide transitions at its ends, thus serving as a surface-mounted filter component in a microstrip conductor environment. As evident, this arrangement does not require openings in the dielectric carrier material.

In a specially preferred embodiment of the present invention, applicable for all embodiment examples of the present invention, a broad-band matching in the form of a specially developed iris is provided. For the first embodiment, as shown in FIG. 2a, FIG. 2b, and FIG. 5, an iris 75 in the form of a ridge made on the fifth wall 16, passing essentially perpendicularly between the second wall 13 and the third wall 14, on the inside of the first surface-mounted waveguide part 5.

The ridge iris is thus in form of a small step, and is placed on the fifth wall 16 adjoining the complete waveguide opening 36 as shown in FIG. 5. The placing of the iris 75 is of course optional, the main idea is to put a ridge, having an adapted height and width, at or before the complete waveguide opening 36. An adapted iris of such a kind has proved to provide a broad-band matching for the discontinuity discussed above.

Figure 8:
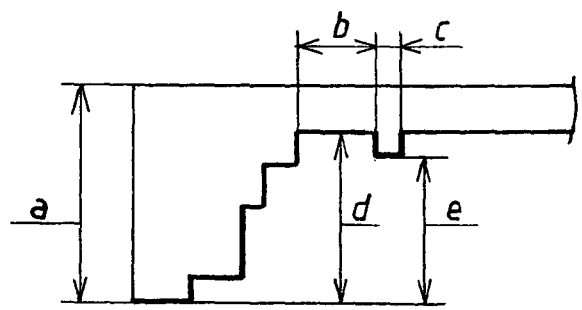
FIG. 8 shows examples of dimensions for a waveguide part according to the present invention.

An example of dimensions for an iris arrangement according to the above is shown in FIG. 8, showing a cross-section of the present invention applied to an IEC R-220. The measures according to the symbols in the Figure are as follows:

$a \approx 4.92$ mm
$b \approx 3.42$ mm
$c \approx 1.0$ mm
$d \approx 3.92$ mm
$e \approx 3.25$ mm Similar irises 76, 77, having the same purpose and being arranged in a similar way, are shown for the second embodiment in FIG. 7a and FIG. 7b. Since there will be two complete waveguide openings for the second embodiment example, two irises 76, 77 are required.

Figure 9:
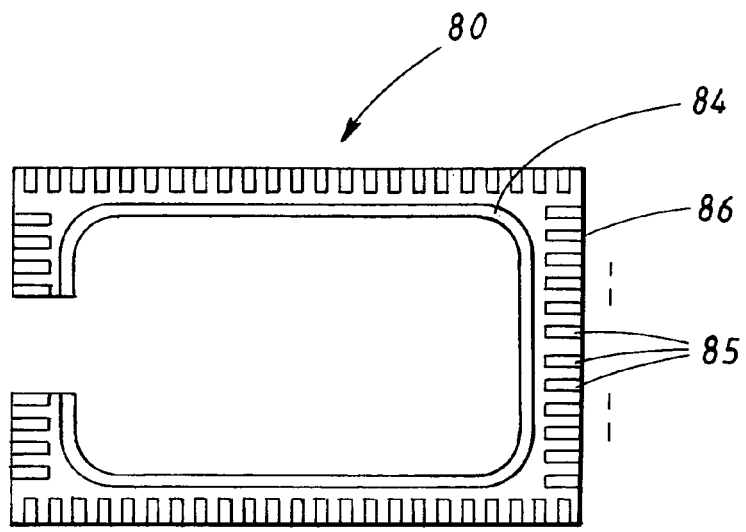
FIG. 9 shows a footprint solder area according to a certain embodiment with enhanced self-alignment properties.
Figure 10:
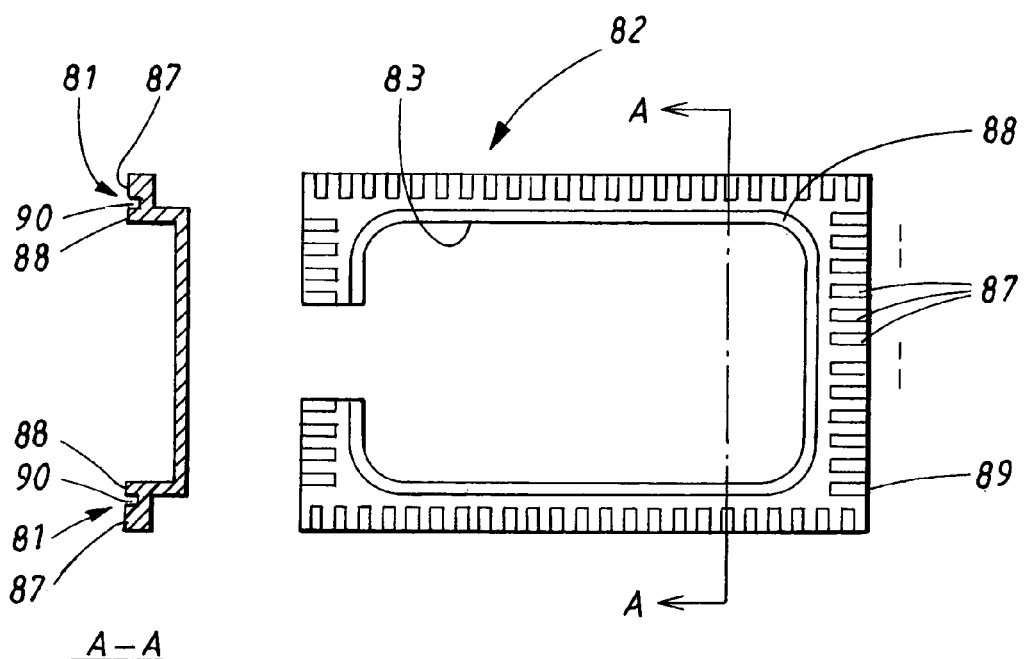
FIG. 10 shows a solderable contact area according to a certain embodiment with enhanced self-alignment properties.

According to another embodiment of the present invention, with reference to FIG. 9 and FIG. 10, the footprint solder area 80 of FIG. 9, corresponding to a solderable contact area 81 on a waveguide part 82, as shown in FIG. 10, is not constituted by a uniformly dispensed copper layer within solder area's boundaries. Instead, the footprint solder area 80 has a certain pattern. The advantage with such a pattern is to obtain an enhanced alignment of the waveguide part 82 when soldered to the footprint solder area 80.

The quality of self-alignment that takes place during the soldering process is enhanced when the part of the footprint solder area 80 that is closest to an inner wall 83 of the waveguide part 82 when mounted forms a separate, relatively thin, continuous part 84 (FIG. 9) that is separate from the rest of the footprint solder area 80. As shown in FIG. 9, the rest of the footprint solder area 80 is constituted by a number of discrete rectangles 85, following the outer edge 86 of the footprint solder area 80. These discrete rectangles 85 form aligning surfaces.

As shown in FIG. 10, the solderable contact area 81 of the waveguide part 82 is correspondingly formed, having a number of matching rectangular feet 87 and a continuous wall part 88 matching the continuous part 84 of the footprint solder area 19. The continuous wall part 88 follows the inner wall 83 of the waveguide part 82, and the square feet 87 follow an outer wall 89.

In FIG. 10, a section of the waveguide part is shown showing that there exists a gap 90 between the matching square feet 87 and the continuous wall part 90.

In this way, alignment forces work on all sides of each rectangle 85, enhancing the self-alignment procedure when the waveguide part 82 is mounted to the footprint solder area 80, since the aligning forces are proportional to the circumferential length of each aligning surface.

Figure 11:
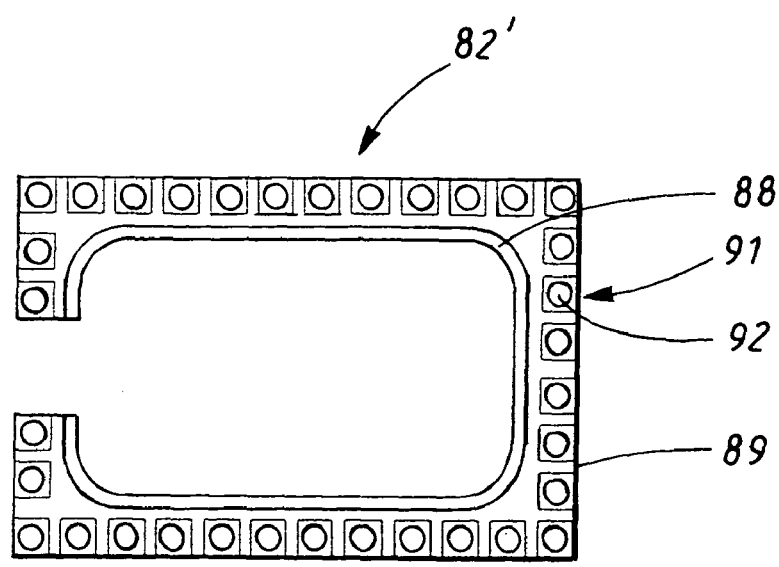
FIG. 11 shows another type of solderable contact area.

As shown in FIG. 11, a waveguide part 82' has an alternative to the rectangular feet. Here, square feet 91, having the copper removed in a circular form 92 in the centre of each square 91, are used. In this way, the circumferential length of each aligning surface, and thus the aligning forces, is increased. For a suitable footprint solder area, copper is removed in a circular form in copper squares correspondingly.

Figure 12:
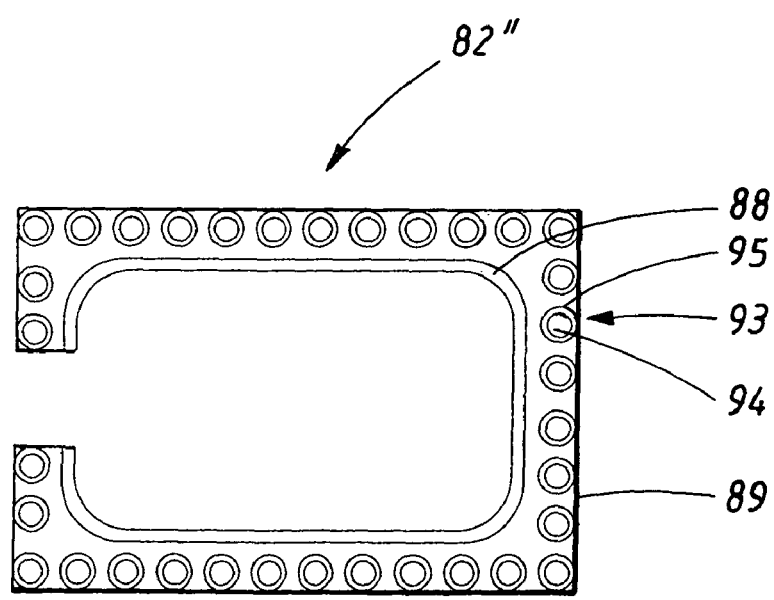
FIG. 12 shows yet another type of solderable contact area.

Yet another alternative of a waveguide part 82" is shown in FIG. 12. Here, circular feet 93, having circular holes 94 formed in the centre of each circular foot 93, forming circular ring feet 95, are used. For a suitable footprint solder area, copper is removed in a circular form in copper circles correspondingly, forming corresponding circular copper rings.

Of course, all shapes discussed above are only exemplary, many other shapes are possible. Squares and rectangles may be exchanged in the examples above, and the circular forms may be oval. The removed copper does not have to be placed in the centre of each copper element, and does not have to be circular. The shape may for example be polygonal. Furthermore, the discrete copper elements do not have to be arranged symmetrically.

As a summary of this embodiment, the use of discrete copper elements in the footprint solder area 80, 80', 80", having corresponding solderable contact areas on a waveguide part 82, forming discrete parts, increases the circumferential length of the aligning surfaces available, and thus the aligning forces.

The present invention is not limited to the embodiments shown, but may vary freely within the scope of the appended claims.

For example, the metalization may be of any suitable metal, and may be in the form of separate metal sheets or pieces.

All measures are presented as examples, of course many suitable measure combinations may be found within the scope of the present invention. All measures are of course also dependent on the frequency used.

In the first embodiment, with reference to FIG. 1, a solderstop line 78 is preferably placed across the width of the microstrip conductor 6 where the contact part 25 of the stepped structure 24 is intended to be soldered to the microstrip conductor 6. The solderstop line 78 is placed in such a way that solder is prevented from flowing outwards, from the first waveguide part 5.

With further reference to FIG. 1, a fence of via holes 79 is preferably placed at the border of the part of the footprint 4 that constitutes the sixth wall that faces the incoming microstrip conductor 6. This is common knowledge for such a transition, and provides a better ground contact, since the vias are arranged to contact the underlying ground plane 31.

Solderstop materials are well known in the art, and solderstop lines 29, 72, 78 are preferably made by epoxy or some other common solderstop material.

Applying solder lines may be performed in many known ways, for example dispensing or screen-printing.

The opening forming a waveguide contact interface, or waveguide port, on the second side of the dielectric carrier, may be formed in such a way that the copper cladding is etched away at the place of the opening, but the dielectric material itself remains.

An example of a measure of the height H in FIG. 3 is about 125 μm.

The invention claimed is:

1. A surface-mountable waveguide arrangement comprising:
   a dielectric carrier material having a first main side and a second main side, the second side comprising a ground plane, and the first side forming a microwave circuit layout by means of metallization patterns on the respective sides, the microwave circuit layout further comprising a footprint for a surface-mountable waveguide part;
   a waveguide part comprising an open side;
   a part of the footprint constituting a closing wall for closing the open side;
   the waveguide part being mounted to a footprint solder area comprised in the footprint;
   the footprint solder area having an outer contour, said footprint solder area corresponding to a solderable contact area on the waveguide part, wherein
      a solderstop line is formed on the footprint, at least partly defining a border between the closing wall and the footprint solder area,
      the solderable contact area has a width that extends between an inner edge and an outer edge, and
      the solderstop line is arranged to be positioned inside the inner edge when the waveguide part is mounted to the dielectric carrier material.

2. The surface-mountable waveguide arrangement according to claim 1, wherein the solderable contact area further comprises a continuous part extending along an inner wall, and a plurality of discrete parts that are separate from the continuous part and placed between the continuous part and an outer wall, and where the footprint solder area is formed correspondingly.

3. The surface-mountable waveguide arrangement according to claim 2, wherein the plurality of discrete parts are square, rectangular, circular or oval.

4. The surface-mountable waveguide arrangement according to claim 2, where there is a circular hole inside each discrete part.

5. The surface-mountable waveguide arrangement according to claim 1, wherein the surface-mountable waveguide part further comprises a first wall, a second wall, a third wall, a fourth wall, and a fifth wall, where the first through fourth walls essentially form a circumference and the fifth wall constitutes a roof on the top of the first waveguide part coupling the first through fourth walls, the roof being essentially parallel to, and facing away from, the dielectric carrier material when the waveguide part is mounted to the dielectric carrier material.

6. The surface-mountable waveguide arrangement according to claim 5, wherein the surface-mountable waveguide part further comprises a bend, the bend being essentially 90°.

7. The surface-mountable waveguide arrangement according to claim 6, wherein the closing wall comprises at least one opening encompassed by the closing wall, said at least one opening constituting a waveguide opening, said waveguide opening having smaller dimensions than a regular waveguide opening for the waveguide dimensions used, due to the positioning of the solderstop line.

8. The surface-mountable waveguide arrangement according to claim 7, wherein said waveguide opening constitutes a waveguide port.

9. The surface-mountable waveguide arrangement according to claim 7, wherein said opening extends through all of the dielectric carrier material.

10. The surface-mountable waveguide arrangement according to claim 7, further comprising an iris in the form of a ridge being positioned on the fifth wall, passing essentially perpendicularly between the second wall and the third wall on the inside of the surface-mounted waveguide.

11. The surface-mountable waveguide arrangement according to claim 10, wherein the ridge iris is positioned on the fifth wall adjoining the 90° bend.

12. The surface-mountable waveguide arrangement according to claim 10, wherein the ridge iris is designed to compensate for the mismatch that is produced by the size of the waveguide opening.

13. The surface-mountable waveguide arrangement according to claim 5, wherein the at least one of the first wall, the second wall, the third wall, and the fourth wall has an opening for accommodating an incoming microstrip feed line, the surface-mountable waveguide part comprising at least one corresponding microstrip to waveguide transition.

14. The surface-mountable waveguide arrangement according to claim 1, wherein the outer edge is arranged to essentially follow the outer contour of the solderable contact area of the footprint when the waveguide part is mounted to the dielectric carrier material.

* * * * *

UNITED STATES PATENT AND TRADEMARK OFFICE
Certificate

Patent No. 8,081,044 B2

Patented: December 20, 2011

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Per Ligander, Göteborg (SE); Simone Bastioli, Spoleto (IT); and Marcus Karl Hasselblad, Molndal (SE)

Signed and Sealed this Fourteenth Day of May 2013.

ROBERT J. PASCAL
*Supervisory Patent Examiner*
Art Unit 2817
Technology Center 2800